(12) United States Patent
Wang et al.

(10) Patent No.: US 9,640,562 B2
(45) Date of Patent: May 2, 2017

(54) DISPLAY PANEL (71) Applicant: Shenzhen China Star Optoelectronics Technology Co., Ltd., Guangdong (CN)

(72) Inventors: Zui Wang, Guangdong (CN); Jinbo Guo, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 393 days.

(21) Appl. No.: 14/404,133

(22) PCT Filed: Aug. 7, 2014

(86) PCT No.: PCT/CN2014/083859
§ 371 (c)(1),
(2) Date: Nov. 26, 2014

(87) PCT Pub. No.: WO2016/000293
PCT Pub. Date: Jan. 7, 2016

(65) Prior Publication Data
US 2016/0225798 A1    Aug. 4, 2016

(30) Foreign Application Priority Data
Jun. 30, 2014   (CN) .......................... 2014 1 0308596

(51) Int. Cl.
*H01L 27/12* (2006.01)
*G02F 1/13* (2006.01)
*H01L 27/32* (2006.01)
*G02F 1/1362* (2006.01)
*G09G 3/00* (2006.01)

(52) U.S. Cl.
CPC ........ *H01L 27/1244* (2013.01); *G02F 1/1309* (2013.01); *G02F 1/136259* (2013.01); *G09G 3/006* (2013.01); *H01L 27/3211* (2013.01); *G02F 2001/136254* (2013.01); *G02F 2001/136263* (2013.01); *G09G 2300/0413* (2013.01); *G09G 2300/0426* (2013.01); *H01L 27/3276* (2013.01)

(58) Field of Classification Search
CPC  G09G 3/006; G09G 3/36; G09G 3/00; G09G 2300/0852; G09G 3/3648; G09G 3/3607; G09G 2300/04; G09G 2330/04; G09G 2330/12; G09G 2320/0242; G09G 2300/0413; G09G 2300/0426; G02F 1/1362; G02F 2001/136254; G02F 1/1309; G02F 1/136259; G02F 2001/136264; G02F 2001/136263; G01R 31/02; H01L 27/1244; H01L 27/3211; H01L 27/3276
See application file for complete search history.

(56) References Cited

U.S. PATENT DOCUMENTS

| 2015/0199929 A1* | 7/2015 | Kim ...................... G09G 3/006 324/762.01 |
| 2016/0247428 A1* | 8/2016 | Wang .................... G01R 31/02 |
| 2016/0342050 A1* | 11/2016 | Wang ....................... G02F 1/13 |

* cited by examiner

Primary Examiner — Hoang-Quan Ho (57) ABSTRACT

A display panel is disclosed and includes an active area and a non-active area. A first, a second, a third, a fourth, a fifth, and a sixth charging scanning lines and a first, a second, a third, a fourth, a fifth, and a sixth charge-sharing scanning lines of an array unit on the active area are connected to a first, a second, a third, a fourth, a fifth, and a sixth pixel row, respectively. A first, a second, and a third detection lines on the non-active area are connected to the active area.

20 Claims, 3 Drawing Sheets

FIG. 1

PRIOR ART

FIG. 2

FIG. 3

DISPLAY PANEL

RELATED APPLICATIONS

This application is a National Phase of PCT Patent Application No. PCT/CN2014/083859 having International filing date of Aug. 7, 2014, which claims the benefit of priority of Chinese Patent Application No. 201410308596.1 filed on Jun. 30, 2014. The contents of the above applications are all incorporated by reference as if fully set forth herein in their entirety.

BACKGROUND OF THE INVENTION

Field of the Invention

The present invention relates to the field of display technology, and more particularly to a display panel.

Description of the Related Art

In a traditional circuit design of display panels, there are peripheral wires mounted around the pixel area for shorting-bar connection, wherein the odd-numbered and even-numbered scanning lines are guided to the peripheral wires, respectively, meaning that the odd-numbered/even-numbered scanning lines are connected together at the periphery of the display panel. Such design is to give different electric signals to the odd-numbered scanning lines and the even-numbered scanning lines to check if there are any short-circuited or broken circuits exist in the display panel during the inspection procedure of the TFT (Thin Film Transistor) manufacturing process. Cooperating with different data signals, such design can also detect other types of defects. Shorting bars will also be used in lighting inspection during the liquid crystal cell manufacturing process, and will be removed after the inspection so as not to affect the display functions of the finished products.

Figure 1:
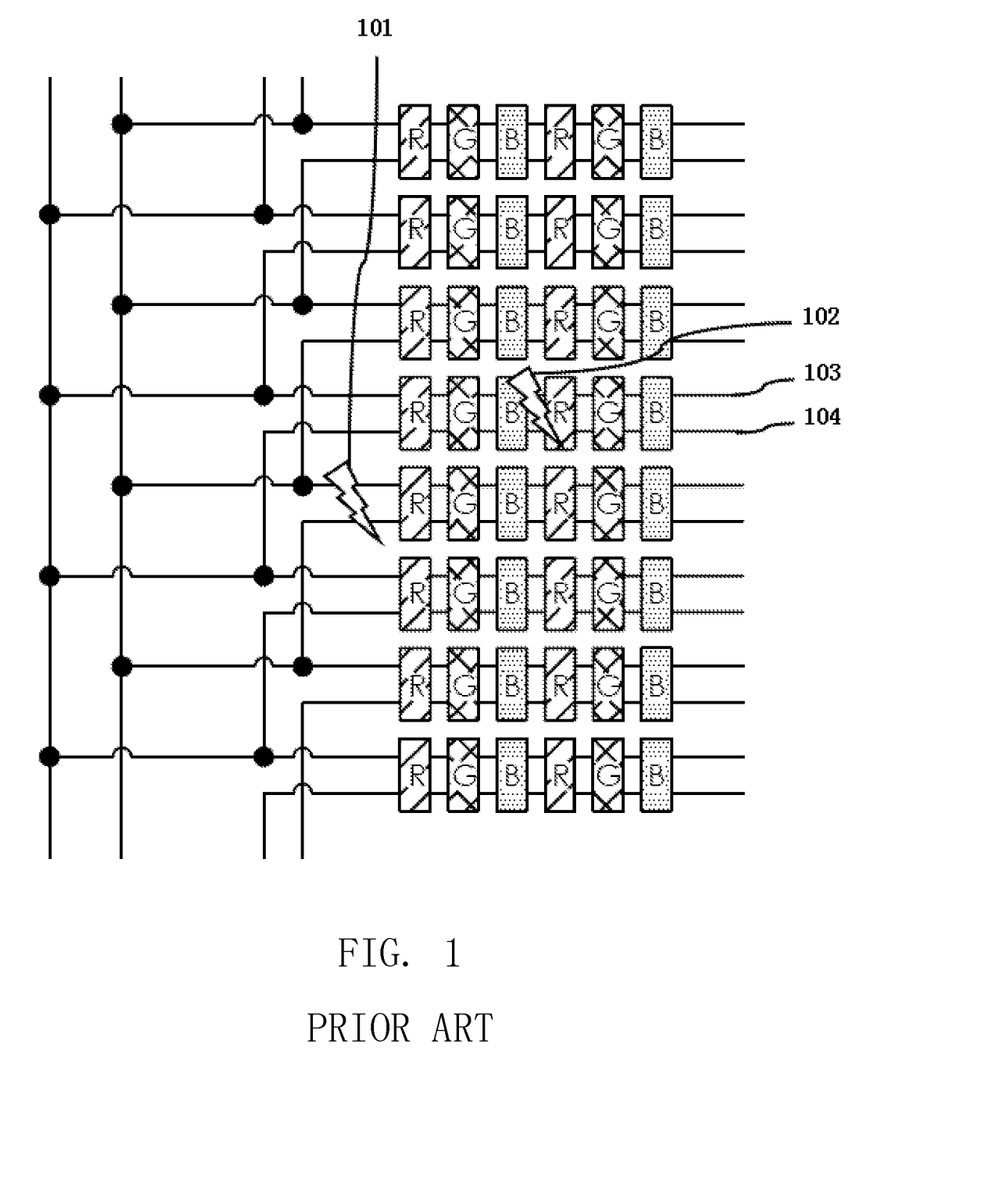
FIG. 1 is a schematic diagram of a traditional display panel.

With reference to FIG. 1, however, in a conventional peripheral wire connection for detecting short-circuit conditions, each pixel row may include a charging scanning line 203 and a charge-sharing scanning line 204, wherein the charge-sharing scanning line 104 (for example, the charge-sharing scanning line 104 may be the $N_{th}$ scanning line in position, wherein N is a positive integer) is usually designed to be connected to a following charging scanning line (for example, the $(N+2)_{th}$ scanning line in position), meaning that the charge-sharing scanning line and the following corresponding charging scanning line are both odd-numbered scanning lines or both even-numbered scanning lines. Thus, if there is a short-circuit condition occurs between a charging scanning line 103 and a charge-sharing scanning line 104 of the same pixel row, such as the first short-circuit position 101 or the second short-circuit position 102 shown in FIG. 1, then the foregoing inspection method of using the shorting bar to connect all of the odd-numbered lines or all of the even-numbered lines cannot detect this short-circuit condition during the TFT manufacturing process, thereby causing low product yield rate.

Therefore, it is necessary to provide a new technical solution to overcome the problems existing in the conventional technology.

SUMMARY OF THE INVENTION

An object of the present invention is to provide a display panel where a short-circuit condition occurring in the display panel can be effectively and precisely detected so as to improve the yield rate of the display panel.

In order to achieve the foregoing object, the technical solutions of the present invention are as follows:

A display panel comprises an active area where there are at least two array units mounted in the active area and arranged along a first direction in an array manner, wherein each one of the array units includes: at least one first pixel row, at least one first charging scanning line, and at least one first charge-sharing scanning line, wherein the first charging scanning line and the first charge-sharing scanning line are all connected to the first pixel row; at least one second pixel row, at least one second charging scanning line, and at least one second charge-sharing scanning line, wherein the second charging scanning line and the second charge-sharing scanning line are all connected to the second pixel row; at least one third pixel row, at least one third charging scanning line, and at least one third charge-sharing scanning line, wherein the third charging scanning line and the third charge-sharing scanning line are all connected to the third pixel row; at least one fourth pixel row, at least one fourth charging scanning line, and at least one fourth charge-sharing scanning line, wherein the fourth charging scanning line and the fourth charge-sharing scanning line are all connected to the fourth pixel row; at least one fifth pixel row, at least one fifth charging scanning line, and at least one fifth charge-sharing scanning line, wherein the fifth charging scanning line and the fifth charge-sharing scanning line are all connected to the fifth pixel row; and at least one sixth pixel row, at least one sixth charging scanning line, and at least one sixth charge-sharing scanning line, wherein the sixth charging scanning line and the sixth charge-sharing scanning line are all connected to the sixth pixel row; wherein the first direction is perpendicular to a line where the first pixel row lies; the first pixel row, the second pixel row, the third pixel row, the fourth pixel row, the fifth pixel row, and the sixth pixel row are arranged along the first direction in order; and at least one non-active area, wherein the non-active area is disposed beside the active area, and the non-active area is provided with at least one first detection line, at least one second detection line, and at least one third detection line, wherein the first detection line, the second detection line and the third detection line are all connected to the active area; any one of the first charging scanning line, the second charging scanning line, the third charging scanning line, the fourth charging scanning line, the fifth charging scanning line, and the sixth charging scanning line is connected to the charge-sharing scanning line which corresponds to a first number; any one of the first detection line, the second detection line, and the third detection line is connected to the charge-sharing scanning line which corresponds to a second number; wherein the first number is equal to the sum of a number to which the pixel row corresponds and a first predetermined integer; wherein the first predetermined integer is an even number larger than or equal to 2; the second number is equal to the sum of a number to which the pixel row corresponds and a second predetermined integer, wherein the second predetermined integer is an odd number larger than or equal to 3; the at least one first detection line, the at least one second detection line and the at least one third detection line in the non-active area form a shorting bar together, wherein shorting bar lies on a line parallel to the first direction.

In the foregoing display panel, the first predetermined integer is 2, and the second predetermined integer is 3.

In the foregoing display panel, the first charge-sharing scanning line is connected to the third charging scanning line; the second charge-sharing scanning line is connected to the fourth charging scanning line; the third charge-sharing scanning line is connected to the fifth charging scanning line; the fourth charge-sharing scanning line is connected to the sixth charging scanning line; the fifth charge-sharing scanning line is connected to the first charging scanning line of anther array unit which is adjacent to the said array unit along the first direction; the sixth charge-sharing scanning line is connected to the second charging scanning line of anther array unit which is adjacent to the said array unit along the first direction.

In the foregoing display panel, the first charging scanning line is connected to the fifth charge-sharing scanning line of another array unit which is adjacent to the said array unit along a direction opposite to the first direction; the second charging scanning line is connected to the sixth charge-sharing scanning line of another array unit which is adjacent to the said array unit along a direction opposite to the first direction.

In the foregoing display panel, the first detection line is connected to the first charge-sharing scanning line and the fourth charge-sharing scanning line; the second detection line is connected to the third charge-sharing scanning line and the sixth charge-sharing scanning line; the third detection line is connected to the second charge-sharing scanning line and the fifth charge-sharing scanning line.

In the foregoing display panel, the first predetermined integer is 4, and the second predetermined integer is 3.

In the foregoing display panel, the first charge-sharing scanning line is connected to the fifth charging scanning line; the second charge-sharing scanning line is connected to the sixth charging scanning line; the third charge-sharing scanning line is connected to the first charging scanning line of another array unit which is adjacent to the said array unit along the first direction; the fourth charge-sharing scanning line is connected to the second charging scanning line of another array unit which is adjacent to the said array unit along the first direction; the fifth charge-sharing scanning line is connected to the third charging scanning line of another array unit which is adjacent to the said array unit along the first direction; the sixth charge-sharing scanning line is connected to the fourth charging scanning line of another array unit which is adjacent to the said array unit along the first direction.

In the foregoing display panel, the first charging scanning line is connected to the third charge-sharing scanning line of another array unit which is adjacent to the said array unit along a direction opposite to the first direction; the second charging scanning line is connected to the fourth charge-sharing scanning line of another array unit which is adjacent to the said array unit along a direction opposite to the first direction; the third charging scanning line is connected to the fifth charge-sharing scanning line of another array unit which is adjacent to the said array unit along a direction opposite to the first direction; the fourth charging scanning line is connected to the sixth charge-sharing scanning line of another array unit which is adjacent to the said array unit along a direction opposite to the first direction.

In the foregoing display panel, the first detection line is connected to the second charge-sharing scanning line and the fifth charge-sharing scanning line; the second detection line is connected to the first charge-sharing scanning line and the fourth charge-sharing scanning line; the third detection line is connected to the third charge-sharing scanning line and the sixth charge-sharing scanning line.

The present invention further provides another display panel having an active area, wherein the active area where there are at least two array units mounted in the active area and arranged along a first direction in an array manner, wherein each one of the array units includes: at least one first pixel row, at least one first charging scanning line, at least one first charge-sharing scanning line, wherein the first charging scanning line and the first charge-sharing scanning line are all connected to the first pixel row; at least one second pixel row, at least one second charging scanning line, at least one second charge-sharing scanning line, wherein the second charging scanning line and the second charge-sharing scanning line are all connected to the second pixel row; at least one third pixel row, at least one third charging scanning line, at least one third charge-sharing scanning line, wherein the third charging scanning line and the third charge-sharing scanning line are all connected to the third pixel row; at least one fourth pixel row, at least one fourth charging scanning line, at least one fourth charge-sharing scanning line, wherein the fourth charging scanning line and the fourth charge-sharing scanning line are all connected to the fourth pixel row; at least one fifth pixel row, at least one fifth charging scanning line, at least one fifth charge-sharing scanning line, wherein the fifth charging scanning line and the fifth charge-sharing scanning line are all connected to the fifth pixel row; at least one sixth pixel row, at least one sixth charging scanning line, at least one sixth charge-sharing scanning line, wherein the sixth charging scanning line and the sixth charge-sharing scanning line are all connected to the sixth pixel row; wherein the first direction is perpendicular to a line where the first pixel row lies, the first pixel row, the second pixel row, the third pixel row, the fourth pixel row, the fifth pixel row, and the sixth pixel row are arranged along the first direction in order; and at least one non-active area, wherein the non-active area is disposed beside the active area, and the non-active area is provided with at least one first detection line, at least one second detection line, and at least one third detection line, wherein the first detection line, the second detection line and the third detection line are all connected to the active area.

In the foregoing display panel, any one of the first charging scanning line, the second charging scanning line, the third charging scanning line, the fourth charging scanning line, the fifth charging scanning line, and the sixth charging scanning line is connected to the charge-sharing scanning line which corresponds to a first number; any one of the first detection line, the second detection line, and the third detection line is connected to the charge-sharing scanning line which corresponds to a second number; wherein the first number is equal to the sum of a number to which the pixel row corresponds and a first predetermined integer; wherein the first predetermined integer is an even number larger than or equal to 2; the second number is equal to the sum of a number to which the pixel row corresponds and a second predetermined integer, wherein the second predetermined integer is an odd number larger than or equal to 3.

In the foregoing display panel, the first predetermined integer is 2, and the second predetermined integer is 3.

In the foregoing display panel, the first charge-sharing scanning line is connected to the third charging scanning line; the second charge-sharing scanning line is connected to the fourth charging scanning line; the third charge-sharing scanning line is connected to the fifth charging scanning line; the fourth charge-sharing scanning line is connected to the sixth charging scanning line; the fifth charge-sharing scanning line is connected to the first charging scanning line of anther array unit which is adjacent to the said array unit along the first direction; the sixth charge-sharing scanning line is connected to the second charging scanning line of anther array unit which is adjacent to the said array unit along the first direction.

In the foregoing display panel, the first charging scanning line is connected to the fifth charge-sharing scanning line of another array unit which is adjacent to the said array unit along a direction opposite to the first direction; the second charging scanning line is connected to the sixth charge-sharing scanning line of another array unit which is adjacent to the said array unit along a direction opposite to the first direction.

In the foregoing display panel, the first detection line is connected to the first charge-sharing scanning line and the fourth charge-sharing scanning line; the second detection line is connected to the third charge-sharing scanning line and the sixth charge-sharing scanning line; and the third detection line is connected to the second charge-sharing scanning line and the fifth charge-sharing scanning line.

In the foregoing display panel, the first predetermined integer is 4, and the second predetermined integer is 3.

In the foregoing display panel, the first charge-sharing scanning line is connected to the fifth charging scanning line; the second charge-sharing scanning line is connected to the sixth charging scanning line; the third charge-sharing scanning line is connected to the first charging scanning line of another array unit which is adjacent to the said array unit along the first direction; the fourth charge-sharing scanning line is connected to the second charging scanning line of another array unit which is adjacent to the said array unit along the first direction; the fifth charge-sharing scanning line is connected to the third charging scanning line of another array unit which is adjacent to the said array unit along the first direction; the sixth charge-sharing scanning line is connected to the fourth charging scanning line of another array unit which is adjacent to the said array unit along the first direction.

In the foregoing display panel, the first charging scanning line is connected to the third charge-sharing scanning line of another array unit which is adjacent to the said array unit along a direction opposite to the first direction; the second charging scanning line is connected to the fourth charge-sharing scanning line of another array unit which is adjacent to the said array unit along a direction opposite to the first direction; the third charging scanning line is connected to the fifth charge-sharing scanning line of another array unit which is adjacent to the said array unit along a direction opposite to the first direction; the fourth charging scanning line is connected to the sixth charge-sharing scanning line of another array unit which is adjacent to the said array unit along a direction opposite to the first direction.

In the foregoing display panel, the first detection line is connected to the second charge-sharing scanning line and the fifth charge-sharing scanning line; the second detection line is connected to the first charge-sharing scanning line and the fourth charge-sharing scanning line; the third detection line is connected to the third charge-sharing scanning line and the sixth charge-sharing scanning line.

In the foregoing display panel, the first detection line, the second detection line and the third detection line in the non-active area form a shorting bar together, and the shorting bar lies on a line parallel to the first direction.

Compared with the conventional technologies, in the display panel of the present invention, the short-circuit condition can be detected during the TFT manufacturing process of the display panel, therefore it helps to increase the efficiency and accuracy of detecting the short circuit condition in the display panel and also helps to improve the yield rate of the display panel and reduce the manufacturing cost of the display panel.

In order to make the contents of the present invention more easily understood, the preferred embodiments of the present invention are described in detail, in cooperation with accompanying drawings, as follows:

DETAILED DESCRIPTION OF THE PREFERRED EMBODIMENTS

The following description of each embodiment is referring to the accompanying drawings so as to illustrate practicable specific embodiments in accordance with the present invention.

Figure 2:
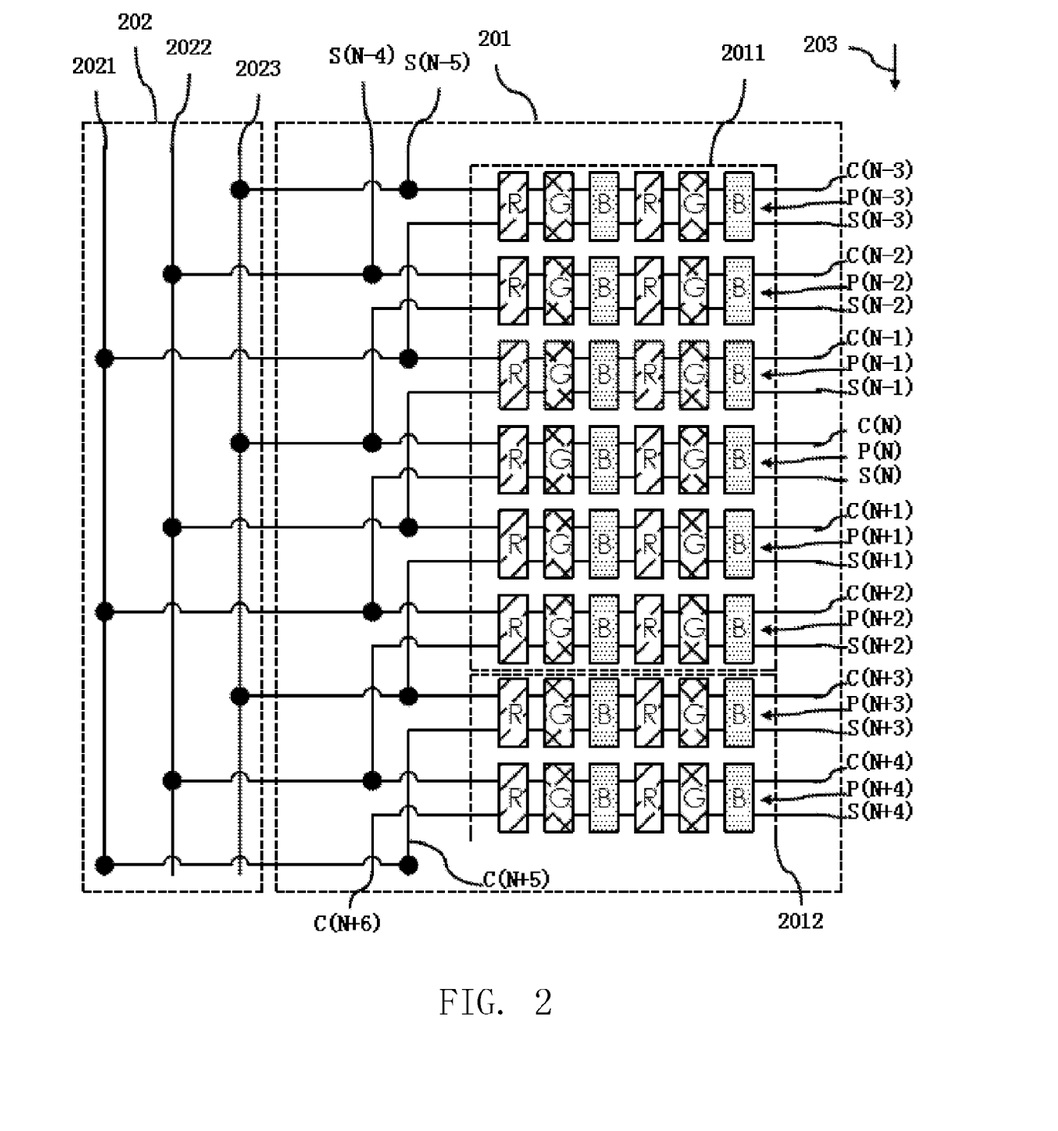
FIG. 2 is a schematic diagram of a display panel according to a first embodiment of the present invention.

Please refer to FIG. 2, which is a schematic diagram of a display panel according to a first embodiment of the present invention.

The display panel of the present embodiment may be an LCD (Liquid Crystal Display) panel, an OLED (Organic Light Emitting Diode) display panel or the like.

The display panel of the embodiment comprises an active area 201 and at least one non-active area 202. The at least one non-active area is disposed beside the active area 201. For example, there may be two non-active areas being arranged at two sides of the active area 201. The display panel is provided with a pixel array. The pixel array is disposed in the active area 201 and is formed by a plurality of pixels.

Specifically, the active area 201 is provided with at least two array units (2011, 2012), and the at least two array units (2011, 2012) are arranged along a first direction 203 in an array manner.

The array unit 2011 includes: at least one first pixel row P(N−3), at least one first charging scanning line C(N−3), at least one first charge-sharing scanning line. The first charging scanning line C(N−3) and the first charge-sharing scanning line S(N−3) are all connected to a first pixel row P(N−3). The first pixel row P(N−3) may include at least one first pixel. The first pixel may include a first main pixel portion and a first subsidiary pixel portion. The first charging scanning line C(N−3) may be connected to one of the first main pixel portion and the first subsidiary pixel portion; and the first charge-sharing scanning line S(N−3) may be connected to the other one of the first main pixel portion and the first subsidiary pixel portion. N is a positive integer.

The array unit 2011 further includes: at least one second pixel row P(N−2), at least one second charging scanning line C(N−2), and at least one second charge-sharing scanning line S(N−2). The second charging scanning line C(N−2) and the second charge-sharing scanning line S(N−2) are all connected to the second pixel row P(N−2). The second pixel row P(N−2) includes at least one second pixel. The second pixel has a second main pixel portion and a second subsidiary pixel portion. The second charging scanning line C(N−2) is connected to one of the second main pixel portion and the second subsidiary pixel portion; and the second charge-sharing scanning line S(N−2) is connected to the other one of the second main pixel portion and the second subsidiary pixel portion. For example, the second charging scanning line C(N−2) is connected to the second main pixel portion, and the second charge-sharing scanning line S(N−2) is connected to the second subsidiary pixel portion; or the second charging scanning line C(N−2) is connected to the second subsidiary pixel portion, and the second charge-sharing scanning line S(N−2) is connected to the second main pixel portion.

The array unit 2011 may further include: at least one third pixel row P(N−1), at least one third charging scanning line C(N−1), and at least one third charge-sharing scanning line S(N−1). The third charging scanning line C(N−1) and the third charge-sharing scanning line S(N−1) are all connected to the third pixel row P(N−1). The third pixel row P(N−1) has at least one third pixel, wherein the third pixel has a third main pixel portion and a third subsidiary pixel portion. The third charging scanning line C(N−1) is connected to one of the third main pixel portion and the third subsidiary pixel portion; and the third charge-sharing scanning line S(N−1) is connected to the other one of the third main pixel portion and the third subsidiary pixel portion.

The array unit 2011 may further include: at least one fourth pixel row P(N), at least one fourth charging scanning line C(N), and at least one fourth charge-sharing scanning line S(N). The fourth charging scanning line C(N) 和 the fourth charge-sharing scanning line S(N) are all connected to the fourth pixel row P(N). The fourth pixel row P(N) includes at least one fourth pixel. The fourth pixel has a fourth main pixel portion and a fourth subsidiary pixel portion. The fourth charging scanning line C(N) is connected to one of the fourth main pixel portion and the fourth subsidiary pixel portion; and the fourth charge-sharing scanning line S(N) is connected to the other one of the fourth main pixel portion and the fourth subsidiary pixel portion.

The array unit 2011 may further include: at least one fifth pixel row P(N+1), at least one fifth charging scanning line C(N+1), and at least one fifth charge-sharing scanning line S(N+1). The fifth charging scanning line C(N+1) and the fifth charge-sharing scanning line S(N+1) are all connected to the fifth pixel row P(N+1). The fifth pixel row P(N+1) includes at least one fifth pixel. The fifth pixel has a fifth main pixel portion and a fifth subsidiary pixel portion. The fifth charging scanning line C(N+1) is connected to one of the fifth main pixel portion and the fifth subsidiary pixel portion; and the fifth charge-sharing scanning line S(N+1) is connected to the other one of the fifth main pixel portion and the fifth subsidiary pixel portion.

The array unit 2011 may further include: at least one sixth pixel row P(N+2), at least one sixth charging scanning line C(N+2), and at least one sixth charge-sharing scanning line S(N+2). The sixth charging scanning line C(N+2) and the sixth charge-sharing scanning line S(N+2) are all connected to the sixth pixel row P(N+2). The sixth pixel row P(N+2) includes at least one sixth pixel. The sixth pixel has a sixth main pixel portion and a sixth subsidiary pixel portion. The sixth charging scanning line C(N+2) is connected to one of the sixth main pixel portion and the sixth subsidiary pixel portion; and the sixth charge-sharing scanning line S(N+2) is connected to the other one of the sixth main pixel portion and the sixth subsidiary pixel portion.

The first direction 203 is perpendicular to a line where the first pixel row P(N−3) lies. The first pixel row P(N−3), the second pixel row P(N−2), the third pixel row P(N−1), the fourth pixel row P(N), the fifth pixel row P(N+1) and the sixth pixel row P(N+2) are arranged along the first direction 203.

The non-active area 202 is provided with at least one first detection line 2021, at least one second detection line 2022, and at least one third detection line 2023. The first detection line 2021, the second detection line 2022, and the third detection line 2023 are all connected to the active area 201. The first detection line 2021, the second detection line 2022, and the third detection line 2023 are arranged along a second direction in an array manner, wherein the second direction is perpendicular to the first direction 203.

In this embodiment, the array unit 2011 is adjacent to another array unit 2012 along the first direction 203. The array unit 2011 may also be adjacent to other array unit along a direction opposite to the first direction 203.

The first detection line 2021, the second detection line 2022 and the third detection line 2023 in the non-active area 202 form a shorting bar together. The shorting bar lies on a line parallel to the first direction 203. That is, the first detection line 2021, the second detection line 2022, the third detection line 2023 are parallel to the first direction 203.

In this embodiment, any one of the first charging scanning line C(N−3), the second charging scanning line C(N−2), the third charging scanning line C(N−1), the fourth charging scanning line C(N), the fifth charging scanning line C(N+1), and the sixth charging scanning line C(N+2) is connected to the charge-sharing scanning line which corresponds to a first number. Any one of the first detection line 2021, the second detection line 2022, and the third detection line 2023 is connected to the charge-sharing scanning line which corresponds to a second number.

The first number is equal to the sum of a number to which the pixel row corresponds and a first predetermined integer; wherein the first predetermined integer is an even number larger than or equal to 2. For example, the first predetermined integer may be 2, 4, 6, 8, etc. The second number is equal to the sum of a number to which the pixel row corresponds and a second predetermined integer; wherein the second predetermined integer is an odd number larger than or equal to 3. For example, the second predetermined integer may be 3, 5, 7, 9, etc. The number to which the pixel row corresponds means the order number of the pixel row, such as the first pixel row corresponds to the number 1, the second pixel number corresponds to the number 2, and so on.

The first charging scanning line C(N−3), the second charging scanning line C(N−2), the third charging scanning line C(N−1), the fourth charging scanning line C(N), the fifth charging scanning line C(N+1) and the sixth charging scanning line C(N+2) are divided into multiple first groups. The number of the first groups is the second predetermined integer. For example, when the second predetermined integer is 3, then there are three first groups, and the number of charging scanning lines each first group has is 2. The charging scanning lines in the same first group are all connected to the same detection line. Furthermore, the adjacent charging scanning lines, where the number thereof is equal to the second predetermined integer (such as 3), which are adjacent to each other along the first direction 203 are connected to different detection lines, respectively. In this embodiment, the detection lines are the first detection line 2021, the second detection line 2022, and the third detection line 2023.

Similarly, the first charge-sharing scanning line S(N−3), the second charge-sharing scanning line S(N−2), the third charge-sharing scanning line S(N−1), the fourth charge-sharing scanning line S(N), the fifth charge-sharing scanning line S(N+1) and the sixth charge-sharing scanning line S(N+2) are also divided into multiple second groups where the number of the second groups is the second predetermined integer. For example, when the second predetermined integer is 3, then there are three second groups, and the number of charge-sharing scanning lines each second group has is 2. The charge-sharing scanning lines in the same second group are all connected to the same detection line. Furthermore, the adjacent charge-sharing scanning lines, where the number thereof is equal to the second predetermined integer (such as three adjacent charge-sharing scanning lines), which are adjacent to each other along the first direction 203 are connected to different detection lines, respectively.

In this embodiment, an example where the first predetermined integer is 2 and the second predetermined integer is 3 will be described as follows:

Specifically, the first charge-sharing scanning line S(N−3) is connected to the third charging scanning line C(N−1). The second charge-sharing scanning line S(N−2) is connected to the fourth charging scanning line C(N). The third charge-sharing scanning line S(N−1) is connected to the fifth charging scanning line C(N+1). The fourth charge-sharing scanning line S(N) is connected to the sixth charging scanning line C(N+2). The fifth charge-sharing scanning line S(N+1) is connected to the first charging scanning line C(N+3) of another array unit 2012 which is adjacent to the present array unit 2012 along the first direction 203. The sixth charge-sharing scanning line S(N+2) is connected to the second charging scanning line C(N+4) of another array unit 2012 which is adjacent to the present array unit 2012 along the first direction 203.

In this embodiment, the first charging scanning line C(N−3) is connected to the fifth charge-sharing scanning line S(N−5) of another array unit which is adjacent to the present array unit 2012 along a direction opposite to the first direction 203. The second charging scanning line C(N−2) is connected to the sixth charge-sharing scanning line S(N−4) of another array unit which is adjacent to the present array unit 2012 along the direction opposite to the first direction 203.

In this embodiment, the first detection line 2021 is connected to the first charge-sharing scanning line S(N−3) and the fourth charge-sharing scanning line S(N). The second detection line 2022 is connected to the third charge-sharing scanning line S(N−1) and the sixth charge-sharing scanning line S(N+2). The third detection line 2023 is connected to the second charge-sharing scanning line S(N−2) and the fifth charge-sharing scanning line S(N+1).

In the foregoing technical solution, when there is a short-circuit condition occurring between the charging scanning line and the charge-sharing scanning line of the same pixel row, the short-circuit condition can be detected during the TFT manufacturing process of the display panel, therefore it helps to increase the efficiency and accuracy of detecting the short-circuit condition in the display panel and also helps to improve the yield rate of the display panel and reduce the manufacturing cost of the display panel.

As shown in FIG. 2, the display panel uses the pixel design of N+2 charging sharing connection where there are three independent shorting-bar wires 2021, 2022 and 2023 (the detection lines) disposed at the periphery of the pixel area, and the scanning lines (the charging scanning lines/the charge-sharing lines) are divided into three groups, and any three adjacent scanning are connected to different shorting-bar wires, respectively. That is, as shown in FIG. 2, scanning lines C(N−1), C(N+2) and C(N+5) are extended and connected to the first detection line 2021; scanning lines C(N−2), C(N+1) and C(N+4) are extended and connected to the second detection line 2022; scanning lines C(N−3), C(N) and C(N+3) are extended and connected to the third detection line 2023. Thus, the short-circuit condition between the charging scanning line and the charge-sharing scanning line of any pixel row can be detected through two of the shorting bars of the first detection line 2021, the second detection line 2022, and the third detection line 2023, thereby increasing the detection rate in the TFT manufacturing process, improving yield rate of products, and lowering manufacturing cost.

Figure 3:
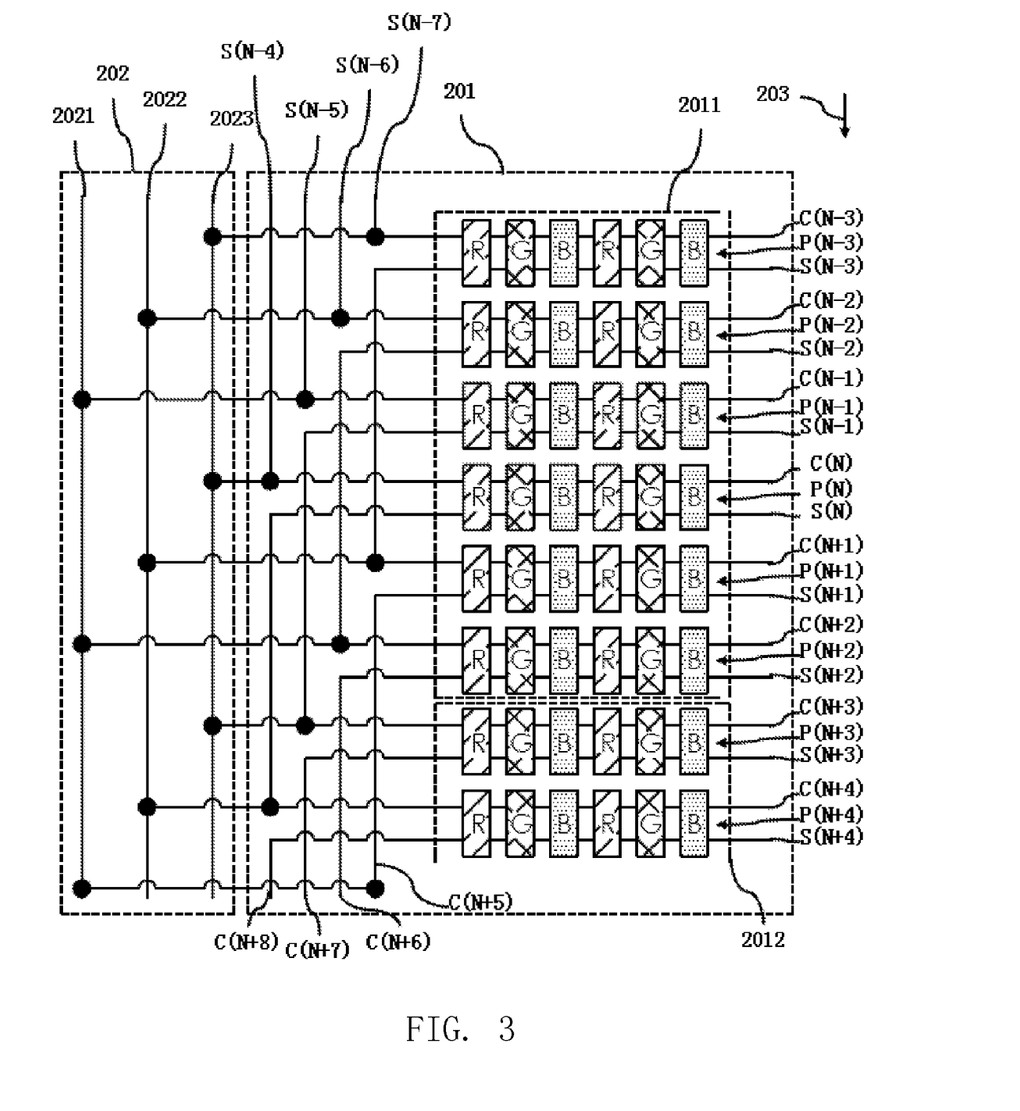
FIG. 3 is a schematic diagram of a display panel according to a second embodiment of the present invention.

Please refer to FIG. 3, which is a schematic diagram of a display panel according to a second embodiment of the present invention. The second embodiment is similar to the first embodiment, the difference is that the first predetermined integer is 4, and the second predetermined integer is 3.

Specifically, the first charge-sharing scanning line S(N−3) is connected to the fifth charging scanning line C(N+1). The second charge-sharing scanning line S(N−2) is connected to the sixth charging scanning line C(N+2). The third charge-sharing scanning line S(N−1) is connected to the first charging scanning line C(N+3) of another array unit which is adjacent to the present array unit 2012 along the first direction 203. The fourth charge-sharing scanning line S(N) is connected to the second charging scanning line C(N+4) of the another array unit which is adjacent to the present array unit 2012 along the first direction 203. The fifth charge-sharing scanning line S(N+1) is connected to the third charging scanning line C(N+5) of the another array unit which is adjacent to the present array unit 2012 along the first direction 203. The sixth charge-sharing scanning line S(N+2) is connected to the fourth charging scanning line C(N+6) of the another array unit which is adjacent to the present array unit 2012 along the first direction 203.

In this embodiment, the first charging scanning line C(N−3) is connected to the third charge-sharing scanning line S(N−7) of another array unit which is adjacent to the present array unit along the direction opposite to the first direction 203. The second charging scanning line C(N−2) is connected to the fourth charge-sharing scanning line S(N−6) of the another array unit which is adjacent to the present array unit along the direction opposite to the first direction 203. The third charging scanning line C(N−1) is connected to the fifth charge-sharing scanning line S(N−5) of the another array unit which is adjacent to the present array unit along the direction opposite to the first direction 203. The fourth charging scanning line C(N) is connected to the sixth charge-sharing scanning line S(N−4) of the another array unit which is adjacent to the present array unit along the direction opposite to the first direction 203.

In this embodiment, the first detection line 2021 is connected to the second charge-sharing scanning line S(N−2) and the fifth charge-sharing scanning line S(N+1). The second detection line 2022 is connected to the first charge-sharing scanning line S(N−3) and the fourth charge-sharing scanning line S(N). The third detection line 2023 is connected to the third charge-sharing scanning line S(N−1) and the sixth charge-sharing scanning line S(N+2).

As shown in FIG. 3, the display panel uses the pixel design of N+4 charging sharing connection where there are three independent shorting-bar wires 2021, 2022 and 2023 (the detection lines) disposed at the periphery of the pixel area, and the scanning lines (the charging scanning lines/the charge-sharing lines) are divided into three groups, and any three adjacent scanning are connected to different shorting-bar wires, respectively. That is, as shown in FIG. 2, scanning lines C(N−1), C(N+2) and C(N+5) are extended and connected to the first detection line 2021; scanning lines C(N−2), C(N+1) and C(N+4) are extended and connected to the second detection line 2022; scanning lines C(N−3), C(N) and C(N+3) are extended and connected to the third detection line 2023. Thus, the short-circuit condition between the charging scanning line and the charge-sharing scanning line of any pixel row can be detected through two of the shorting bars of the first detection line 2021, the second detection line 2022, and the third detection line 2023, thereby increasing the detection rate in the TFT manufacturing process, improving yield rate of products, and lowering manufacturing cost.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A display panel comprising an active area where there are at least two array units mounted in the active area and arranged along a first direction in an array manner, wherein each one of the array units includes:
   at least one first pixel row, at least one first charging scanning line, and at least one first charge-sharing scanning line, wherein the first charging scanning line and the first charge-sharing scanning line are all connected to the first pixel row;
   at least one second pixel row, at least one second charging scanning line, and at least one second charge-sharing scanning line, wherein the second charging scanning line and the second charge-sharing scanning line are all connected to the second pixel row;
   at least one third pixel row, at least one third charging scanning line, and at least one third charge-sharing scanning line, wherein the third charging scanning line and the third charge-sharing scanning line are all connected to the third pixel row;
   at least one fourth pixel row, at least one fourth charging scanning line, and at least one fourth charge-sharing scanning line, wherein the fourth charging scanning line and the fourth charge-sharing scanning line are all connected to the fourth pixel row;
   at least one fifth pixel row, at least one fifth charging scanning line, and at least one fifth charge-sharing scanning line, wherein the fifth charging scanning line and the fifth charge-sharing scanning line are all connected to the fifth pixel row; and
   at least one sixth pixel row, at least one sixth charging scanning line, and at least one sixth charge-sharing scanning line, wherein the sixth charging scanning line and the sixth charge-sharing scanning line are all connected to the sixth pixel row; wherein
   the first direction is perpendicular to a line where the first pixel row lies; the first pixel row, the second pixel row, the third pixel row, the fourth pixel row, the fifth pixel row, and the sixth pixel row are arranged along the first direction in order; and
   at least one non-active area, wherein the non-active area is disposed beside the active area, and the non-active area is provided with at least one first detection line, at least one second detection line, and at least one third detection line; wherein the first detection line, the second detection line and the third detection line are all connected to the active area;
   any one of the first charging scanning line, the second charging scanning line, the third charging scanning line, the fourth charging scanning line, the fifth charging scanning line, and the sixth charging scanning line is connected to the charge-sharing scanning line which corresponds to a first number;
   any one of the first detection line, the second detection line, and the third detection line is connected to the charge-sharing scanning line which corresponds to a second number; wherein the first number is equal to the sum of a number to which the pixel row corresponds and a first predetermined integer; wherein the first predetermined integer is an even number larger than or equal to 2; the second number is equal to the sum of a number to which the pixel row corresponds and a second predetermined integer, wherein the second predetermined integer is an odd number larger than or equal to 3;
   the at least one first detection line, the at least one second detection line and the at least one third detection line in the non-active area form a shorting bar together, wherein shorting bar lies on a line parallel to the first direction.

2. The display panel as claimed in claim 1, wherein the first predetermined integer is 2, and the second predetermined integer is 3.

3. The display panel as claimed in claim 2, wherein the first charge-sharing scanning line is connected to the third charging scanning line;
   the second charge-sharing scanning line is connected to the fourth charging scanning line;
   the third charge-sharing scanning line is connected to the fifth charging scanning line;
   the fourth charge-sharing scanning line is connected to the sixth charging scanning line;
   the fifth charge-sharing scanning line is connected to the first charging scanning line of another array unit which is adjacent to the said array unit along the first direction; and
   the sixth charge-sharing scanning line is connected to the second charging scanning line of another array unit which is adjacent to the said array unit along the first direction.

4. The display panel as claimed in claim 3, wherein the first charging scanning line is connected to the fifth charge-sharing scanning line of another array unit which is adjacent to the said array unit along a direction opposite to the first direction;
   the second charging scanning line is connected to the sixth charge-sharing scanning line of another array unit which is adjacent to the said array unit along a direction opposite to the first direction.

5. The display panel as claimed in claim 3, wherein the first detection line is connected to the first charge-sharing scanning line and the fourth charge-sharing scanning line;
   the second detection line is connected to the third charge-sharing scanning line and the sixth charge-sharing scanning line;
   the third detection line is connected to the second charge-sharing scanning line and the fifth charge-sharing scanning line.

6. The display panel as claimed in claim 1, wherein the first predetermined integer is 4, and the second predetermined integer is 3.

7. The display panel as claimed in claim 6, wherein the first charge-sharing scanning line is connected to the fifth charging scanning line;
   the second charge-sharing scanning line is connected to the sixth charging scanning line;

the third charge-sharing scanning line is connected to the first charging scanning line of another array unit which is adjacent to the said array unit along the first direction;

the fourth charge-sharing scanning line is connected to the second charging scanning line of another array unit which is adjacent to the said array unit along the first direction;

the fifth charge-sharing scanning line is connected to the third charging scanning line of another array unit which is adjacent to the said array unit along the first direction; and the sixth charge-sharing scanning line is connected to the fourth charging scanning line of another array unit which is adjacent to the said array unit along the first direction.

8. The display panel as claimed in claim 7, wherein the first charging scanning line is connected to the third charge-sharing scanning line of another array unit which is adjacent to the said array unit along a direction opposite to the first direction;

the second charging scanning line is connected to the fourth charge-sharing scanning line of another array unit which is adjacent to the said array unit along a direction opposite to the first direction;

the third charging scanning line is connected to the fifth charge-sharing scanning line of another array unit which is adjacent to the said array unit along a direction opposite to the first direction;

the fourth charging scanning line is connected to the sixth charge-sharing scanning line of another array unit which is adjacent to the said array unit along a direction opposite to the first direction.

9. The display panel as claimed in claim 7, wherein the first detection line is connected to the second charge-sharing scanning line and the fifth charge-sharing scanning line;

the second detection line is connected to the first charge-sharing scanning line and the fourth charge-sharing scanning line; and the third detection line is connected to the third charge-sharing scanning line and the sixth charge-sharing scanning line.

10. A display panel comprising an active area where there are at least two array units mounted in the active area and arranged along a first direction in an array manner, and each one of the array units includes:

at least one first pixel row, at least one first charging scanning line, at least one first charge-sharing scanning line, wherein the first charging scanning line and the first charge-sharing scanning line are all connected to the first pixel row;

at least one second pixel row, at least one second charging scanning line, at least one second charge-sharing scanning line, wherein the second charging scanning line and the second charge-sharing scanning line are all connected to the second pixel row;

at least one third pixel row, at least one third charging scanning line, at least one third charge-sharing scanning line, wherein the third charging scanning line and the third charge-sharing scanning line are all connected to the third pixel row;

at least one fourth pixel row, at least one fourth charging scanning line, at least one fourth charge-sharing scanning line, wherein the fourth charging scanning line and the fourth charge-sharing scanning line are all connected to the fourth pixel row;

at least one fifth pixel row, at least one fifth charging scanning line, at least one fifth charge-sharing scanning line, wherein the fifth charging scanning line and the fifth charge-sharing scanning line are all connected to the fifth pixel row;

at least one sixth pixel row, at least one sixth charging scanning line, at least one sixth charge-sharing scanning line, wherein the sixth charging scanning line and the sixth charge-sharing scanning line are all connected to the sixth pixel row; wherein the first direction is perpendicular to a line where the first pixel row lies, the first pixel row, the second pixel row, the third pixel row, the fourth pixel row, the fifth pixel row, and the sixth pixel row are arranged along the first direction in order; and at least one non-active area, wherein the non-active area is disposed beside the active area, and the non-active area is provided with at least one first detection line, at least one second detection line, and at least one third detection line, wherein the first detection line, the second detection line and the third detection line are all connected to the active area.

11. The display panel as claimed in claim 10, wherein any one of the first charging scanning line, the second charging scanning line, the third charging scanning line, the fourth charging scanning line, the fifth charging scanning line, and the sixth charging scanning line is connected to the charge-sharing scanning line which corresponds to a first number;

any one of the first detection line, the second detection line, and the third detection line is connected to the charge-sharing scanning line which corresponds to a second number; wherein the first number is equal to the sum of a number to which the pixel row corresponds and a first predetermined integer; wherein the first predetermined integer is an even number larger than or equal to 2; the second number is equal to the sum of a number to which the pixel row corresponds and a second predetermined integer, wherein the second predetermined integer is an odd number larger than or equal to 3.

12. The display panel as claimed in claim 11, wherein the first predetermined integer is 2, and the second predetermined integer is 3.

13. The display panel as claimed in claim 12, wherein the first charge-sharing scanning line is connected to the third charging scanning line;

the second charge-sharing scanning line is connected to the fourth charging scanning line;

the third charge-sharing scanning line is connected to the fifth charging scanning line;

the fourth charge-sharing scanning line is connected to the sixth charging scanning line;

the fifth charge-sharing scanning line is connected to the first charging scanning line of anther array unit which is adjacent to the said array unit along the first direction; and the sixth charge-sharing scanning line is connected to the second charging scanning line of anther array unit which is adjacent to the said array unit along the first direction.

14. The display panel as claimed in claim 13, wherein the first charging scanning line is connected to the fifth charge-sharing scanning line of another array unit which is adjacent to the said array unit along a direction opposite to the first direction; and the second charging scanning line is connected to the sixth charge-sharing scanning line of another array unit which is adjacent to the said array unit along a direction opposite to the first direction.

15. The display panel as claimed in claim 13, wherein the first detection line is connected to the first charge-sharing scanning line and the fourth charge-sharing scanning line;
the second detection line is connected to the third charge-sharing scanning line and the sixth charge-sharing scanning line; and
the third detection line is connected to the second charge-sharing scanning line and the fifth charge-sharing scanning line.

16. The display panel as claimed in claim 11, wherein the first predetermined integer is 4, and the second predetermined integer is 3.

17. The display panel as claimed in claim 16, wherein the first charge-sharing scanning line is connected to the fifth charging scanning line;
the second charge-sharing scanning line is connected to the sixth charging scanning line;
the third charge-sharing scanning line is connected to the first charging scanning line of another array unit which is adjacent to the said array unit along the first direction;
the fourth charge-sharing scanning line is connected to the second charging scanning line of another array unit which is adjacent to the said array unit along the first direction;
the fifth charge-sharing scanning line is connected to the third charging scanning line of another array unit which is adjacent to the said array unit along the first direction unit along the first direction; and
the sixth charge-sharing scanning line is connected to the fourth charging scanning line of another array unit which is adjacent to the said array unit along the first direction unit along the first direction.

18. The display panel as claimed in claim 17, wherein the first charging scanning line is connected to the third charge-sharing scanning line of another array unit which is adjacent to the said array unit along a direction opposite to the first direction;
the second charging scanning line is connected to the fourth charge-sharing scanning line of another array unit which is adjacent to the said array unit along a direction opposite to the first direction;
the third charging scanning line is connected to the fifth charge-sharing scanning line of another array unit which is adjacent to the said array unit along a direction opposite to the first direction;
the fourth charging scanning line is connected to the sixth charge-sharing scanning line of another array unit which is adjacent to the said array unit along a direction opposite to the first direction.

19. The display panel as claimed in claim 17, wherein the first detection line is connected to the second charge-sharing scanning line and the fifth charge-sharing scanning line;
the second detection line is connected to the first charge-sharing scanning line and the fourth charge-sharing scanning line; and
the third detection line is connected to the third charge-sharing scanning line and the sixth charge-sharing scanning line.

20. The display panel as claimed in claim 10, wherein the at least one first detection line, the at least one second detection line and the at least one third detection line in the non-active area form a shorting bar together, and the shorting bar lies on a line parallel to the first direction.

* * * * *